US006825068B2

(12) United States Patent
Denis et al.

(10) Patent No.: US 6,825,068 B2
(45) Date of Patent: Nov. 30, 2004

(54) PROCESS FOR FABRICATING THIN FILM TRANSISTORS

(75) Inventors: Kevin L. Denis, Beverly Farms, MA (US); Yu Chen, Cambridge, MA (US); Paul S. Drzaic, Lexington, MA (US); Joseph M. Jacobson, Newton Centre, MA (US); Peter T. Kazlas, Sudbury, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/836,884

(22) Filed: Apr. 17, 2001

(65) Prior Publication Data

US 2002/0019081 A1 Feb. 14, 2002

Related U.S. Application Data

(60) Provisional application No. 60/197,731, filed on Apr. 18, 2000.

(51) Int. Cl.[7] .......................... H01L 21/00; H01L 21/84
(52) U.S. Cl. ........................................ 438/149; 438/155
(58) Field of Search ........................ 438/30, 149, 152, 438/155

(56) References Cited

U.S. PATENT DOCUMENTS

| 3,036,388 A | 5/1962 | Tate ............................... 35/66 |
| 3,384,488 A | 5/1968 | Tulagin et al. .................. 96/88 |
| 3,612,758 A | 10/1971 | Evans et al. ............. 178/5.4 R |
| 3,670,323 A | 6/1972 | Sobel et al. ................. 340/324 |
| 3,745,070 A | 7/1973 | Yada et al. ................... 148/1.5 |
| 3,767,392 A | 10/1973 | Ota ................................ 96/1 |
| 3,792,308 A | 2/1974 | Ota ............................ 315/150 |
| 3,806,893 A | 4/1974 | Ohnishi et al. ....... 340/173 CH |
| 3,850,627 A | 11/1974 | Wells et al. .................. 96/1.3 |
| 3,972,040 A | 7/1976 | Hilsum et al. ......... 340/324 M |
| 4,001,140 A | 1/1977 | Foris et al. .................. 252/316 |
| 4,041,481 A | 8/1977 | Sato ....................... 340/324 M |
| 4,045,327 A | 8/1977 | Noma et al. ............ 204/299 R |
| 4,068,927 A | 1/1978 | White .................... 350/160 R |
| 4,071,430 A | 1/1978 | Liebert .................... 204/299 R |
| 4,088,395 A | 5/1978 | Gigila ........................ 350/357 |
| 4,123,346 A | 10/1978 | Ploix ....................... 204/299 R |
| 4,149,149 A | 4/1979 | Miki et al. .................. 340/753 |
| 4,203,106 A | 5/1980 | Dalisa et al. ............... 340/787 |
| 4,218,302 A | 8/1980 | Dalisa et al. ........... 204/299 R |
| 4,261,653 A | 4/1981 | Goodrich .................... 350/362 |
| 4,273,672 A | 6/1981 | Vassiliades ................. 252/316 |
| 4,305,807 A | 12/1981 | Somlyody ............... 204/299 R |
| 4,311,361 A | 1/1982 | Somlyody ................... 350/267 |
| 4,324,456 A | 4/1982 | Dalisa ........................ 350/362 |
| 4,390,403 A | 6/1983 | Batchelder .............. 204/180 R |
| 4,418,346 A | 11/1983 | Batchelder .................. 340/787 |
| 4,430,648 A | 2/1984 | Togashi et al. ............. 340/718 |
| 4,439,507 A | 3/1984 | Pan et al. ..................... 430/59 |
| 4,450,440 A | 5/1984 | White ........................ 340/753 |
| 4,502,934 A | 3/1985 | Gazard et al. ............... 204/242 |
| 4,522,472 A | 6/1985 | Liebert et al. .............. 350/362 |
| 4,543,306 A | 9/1985 | Dubois et al. .............. 429/194 |
| 4,598,960 A | 7/1986 | DiSanto et al. .......... 339/17 M |
| 4,643,528 A | 2/1987 | Bell, Jr. ...................... 350/334 |
| 4,648,956 A | 3/1987 | Marshall et al. ...... 204/299 EC |
| 4,655,897 A | 4/1987 | DiSanto et al. ......... 204/299 R |
| 4,686,524 A | 8/1987 | White ........................ 340/787 |
| 4,741,604 A | 5/1988 | Kornfeld .................... 350/362 |
| 4,742,345 A | 5/1988 | Di Santo et al. ........... 340/787 |
| 4,746,917 A | 5/1988 | Di Santo et al. ........... 340/787 |
| 4,758,875 A | 7/1988 | Fujisaki et al. ............... 357/72 |
| 4,776,675 A | 10/1988 | Takaochi et al. ............ 350/339 |
| 4,828,967 A | 5/1989 | Mase et al. ................. 430/315 |
| 4,833,464 A | 5/1989 | Di Santo et al. ........... 340/793 |
| 4,850,919 A | 7/1989 | DiSanto et al. ............... 445/24 |
| 4,883,561 A | 11/1989 | Gmitter et al. ............. 156/633 |
| 4,892,607 A | 1/1990 | DiSanto et al. .......... 156/275.7 |
| 4,931,019 A | 6/1990 | Park ........................... 434/409 |
| 4,947,159 A | 8/1990 | Di Santo et al. ........... 340/787 |
| 4,954,612 A | 9/1990 | Nomura et al. ............. 528/353 |
| 5,008,590 A | 4/1991 | Huisman et al. ............ 313/500 |
| 5,009,490 A | 4/1991 | Kouno et al. ............... 350/342 |
| 5,028,841 A | 7/1991 | DiSanto et al. ............. 313/505 |
| 5,041,824 A | 8/1991 | DiSanto et al. ............. 340/787 |
| 5,053,763 A | 10/1991 | DiSanto et al. ............. 340/787 |
| 5,066,105 A | 11/1991 | Yoshimoto et al. ........... 359/58 |
| 5,066,946 A | 11/1991 | Disanto et al. ............. 340/787 |
| 5,070,326 A | 12/1991 | Yoshimoto et al. ......... 340/719 |

(List continued on next page.)

FOREIGN PATENT DOCUMENTS

| EP | 0 344 367 A1 | 12/1989 |
| EP | 0 361 420 A2 | 4/1990 |
| EP | 0 363 030 A2 | 4/1990 |

(List continued on next page.)

OTHER PUBLICATIONS

Patent Abstracts of Japan, "Composite material having vapor desposited thin film of polyphenylene and its production", Koichi e al. (Publication No.: 06–248429), Sep. 6, 1994.*

Bohnke et al., "Polymer–Based Solid Electrochromic Cell for Matrix–Addressable Display Devices." J. Electrochem. Soc., 138, 3612 (1991).

Chiang, A., et al., "A High Speed Electrophoretic Matrix Display", SID 80 Digest (1980), 114.

(List continued on next page.)

*Primary Examiner*—W. David Coleman
*Assistant Examiner*—Khiem Nguyen
(74) *Attorney, Agent, or Firm*—David J. Cole

(57) ABSTRACT

Transistors are formed by depositing at least one layer of semiconductor material on a substrate comprising a polyphenylene polyimide. The substrate permits the use of processing temperatures in excess of 300° C. during the processes used to form the transistors, thus allowing the formation of high quality silicon semiconductor layers. The substrate also has a low coefficient of thermal expansion, which closely matches that of silicon, thus reducing any tendency for a silicon layer to crack or delaminate.

25 Claims, 1 Drawing Sheet

U.S. PATENT DOCUMENTS

| | | | | |
|---|---|---|---|---|
| 5,077,157 | A | 12/1991 | DiSanto et al. | 430/20 |
| 5,105,185 | A | 4/1992 | Nakanowatari et al. | 340/784 |
| 5,119,218 | A | 6/1992 | Yoshimoto et al. | 349/41 |
| 5,128,226 | A | 7/1992 | Hung | 430/58 |
| 5,128,785 | A | 7/1992 | Yoshimoto et al. | 359/58 |
| 5,148,300 | A | 9/1992 | Mizushima et al. | 359/76 |
| 5,161,007 | A | 11/1992 | Takanashi et al. | 358/43 |
| 5,174,882 | A | 12/1992 | DiSanto et al. | 204/299 R |
| 5,175,020 | A * | 12/1992 | Doellein et al. | 427/569 |
| 5,187,609 | A | 2/1993 | DiSanto et al. | 359/296 |
| 5,194,852 | A | 3/1993 | More et al. | 340/712 |
| 5,206,749 | A | 4/1993 | Zavracky | 359/59 |
| 5,216,416 | A | 6/1993 | DiSanto et al. | 340/787 |
| 5,220,316 | A | 6/1993 | Kazan | 340/784 |
| 5,223,115 | A | 6/1993 | DiSanto et al. | 204/299 R |
| 5,223,823 | A | 6/1993 | Disanto et al. | 340/787 |
| 5,234,541 | A | 8/1993 | Shannon et al. | 216/13 |
| 5,247,290 | A | 9/1993 | DiSanto et al. | 345/107 |
| 5,250,938 | A | 10/1993 | DiSanto et al. | 345/107 |
| 5,254,981 | A | 10/1993 | Disanto et al. | 345/107 |
| 5,266,937 | A | 11/1993 | DiSanto et al. | 345/107 |
| 5,270,843 | A | 12/1993 | Wang | 359/52 |
| 5,276,438 | A | 1/1994 | DiSanto et al. | 345/107 |
| 5,279,694 | A | 1/1994 | DiSanto et al. | 156/275.5 |
| 5,293,528 | A | 3/1994 | DiSanto et al. | 345/107 |
| 5,296,974 | A | 3/1994 | Tada et al. | 359/885 |
| 5,302,235 | A | 4/1994 | DiSanto et al. | 156/643 |
| 5,303,073 | A | 4/1994 | Shirota et al. | 359/51 |
| 5,304,439 | A | 4/1994 | Disanto et al. | 430/20 |
| 5,315,312 | A | 5/1994 | DiSanto et al. | 345/107 |
| 5,345,251 | A | 9/1994 | DiSanto et al. | 345/107 |
| 5,362,671 | A | 11/1994 | Zavracky et al. | 437/81 |
| 5,383,008 | A | 1/1995 | Sheridon | 355/256 |
| 5,389,945 | A | 2/1995 | Sheridon | 345/85 |
| 5,402,145 | A | 3/1995 | Disanto et al. | 345/107 |
| 5,403,772 | A | 4/1995 | Zhang et al. | 437/101 |
| 5,412,398 | A | 5/1995 | DiSanto et al. | 345/107 |
| 5,460,688 | A | 10/1995 | DiSanto et al. | 216/5 |
| 5,463,491 | A | 10/1995 | Check, III | 359/296 |
| 5,463,492 | A | 10/1995 | Check, III | 359/296 |
| 5,467,107 | A | 11/1995 | DiSanto et al. | 345/107 |
| 5,500,537 | A | 3/1996 | Tsumura et al. | 257/40 |
| 5,508,720 | A | 4/1996 | DiSanto et al. | 345/169 |
| 5,543,589 | A | 8/1996 | Buchana et al. | 178/18.03 |
| 5,545,291 | A | 8/1996 | Smith et al. | 156/655.1 |
| 5,561,539 | A * | 10/1996 | Funahata et al. | 349/70 |
| 5,565,885 | A | 10/1996 | Tamanoi | 345/100 |
| 5,569,610 | A | 10/1996 | Zhang et al. | 437/21 |
| 5,573,711 | A | 11/1996 | Hou et al. | 252/572 |
| 5,575,554 | A | 11/1996 | Guritz | 362/103 |
| 5,583,675 | A | 12/1996 | Yamada et al. | 349/84 |
| 5,614,340 | A | 3/1997 | Bugner et al. | 430/41 |
| 5,623,585 | A | 4/1997 | Matias et al. | 395/115 |
| 5,625,199 | A | 4/1997 | Baumbach et al. | 257/40 |
| 5,627,561 | A | 5/1997 | Laspina et al. | 345/107 |
| 5,650,199 | A | 7/1997 | Chang et al. | 427/33 |
| 5,650,872 | A | 7/1997 | Saxe et al. | 359/296 |
| 5,684,501 | A | 11/1997 | Knapp et al. | 345/94 |
| 5,688,584 | A | 11/1997 | Casson et al. | 428/209 |
| 5,705,424 | A | 1/1998 | Zavracky et al. | 437/86 |
| 5,707,738 | A | 1/1998 | Hou | 428/402 |
| 5,709,979 | A | 1/1998 | Casson et al. | 430/311 |
| 5,717,514 | A | 2/1998 | Sheridon | 359/296 |
| 5,718,996 | A | 2/1998 | Iijima et al. | 430/56 |
| 5,725,935 | A | 3/1998 | Rajan | 428/195 |
| 5,731,116 | A | 3/1998 | Matsuo et al. | 430/56 |
| 5,737,115 | A | 4/1998 | Mackinlay et al. | 359/296 |
| 5,738,977 | A | 4/1998 | Van Der Sluis-Van Der Voort et al. | 430/313 |
| 5,744,283 | A | 4/1998 | Spierings et al. | 430/313 |
| 5,783,856 | A | 7/1998 | Smith et al. | 257/618 |
| 5,786,875 | A | 7/1998 | Brader et al. | 349/20 |
| 5,821,137 | A | 10/1998 | Wakai et al. | 438/163 |
| 5,854,380 | A | 12/1998 | Seto et al. | 528/353 |
| 5,892,244 | A | 4/1999 | Tanaka et al. | 257/40 |
| 5,892,504 | A | 4/1999 | Knapp | 345/204 |
| 5,894,367 | A | 4/1999 | Sheridon | 359/623 |
| 5,898,416 | A | 4/1999 | Kuijk et al. | 345/90 |
| 5,904,545 | A | 5/1999 | Smith et al. | 438/455 |
| 5,930,026 | A | 7/1999 | Jacobson et al. | 359/256 |
| 5,936,259 | A | 8/1999 | Katz et al. | 257/40 |
| 5,961,804 | A | 10/1999 | Jacobson et al. | 204/606 |
| 5,969,376 | A | 10/1999 | Bao | 257/40 |
| 5,972,493 | A | 10/1999 | Iwasaki et al. | 428/323 |
| 5,980,763 | A | 11/1999 | Young | 216/23 |
| 6,005,791 | A | 12/1999 | Gudesen et al. | 365/114 |
| 6,005,817 | A | 12/1999 | Gudesen et al. | 365/215 |
| 6,013,335 | A | 1/2000 | Hirata et al. | 427/553 |
| 6,017,584 | A | 1/2000 | Albert et al. | 427/313.3 |
| 6,027,958 | A | 2/2000 | Vu et al. | 438/110 |
| 6,045,955 | A | 4/2000 | Vincent | 430/45 |
| 6,052,354 | A | 4/2000 | Gudesen et al. | 369/112 |
| 6,055,180 | A | 4/2000 | Gudesen et al. | 365/175 |
| 6,064,091 | A | 5/2000 | Deane et al. | 257/347 |
| 6,067,185 | A | 5/2000 | Albert et al. | 359/296 |
| 6,084,850 | A | 7/2000 | Gudesen et al. | 369/275.1 |
| 6,088,319 | A | 7/2000 | Gudesen | 369/97 |
| 6,091,382 | A | 7/2000 | Shioya et al. | 345/76 |
| 6,118,426 | A | 9/2000 | Albert et al. | 345/107 |
| 6,120,588 | A | 9/2000 | Jacobson | 106/31.16 |
| 6,120,839 | A | 9/2000 | Comiskey et al. | 427/213.3 |
| 6,124,851 | A | 9/2000 | Jacobson | 345/206 |
| 6,130,773 | A | 10/2000 | Jacobson et al. | 359/296 |
| 6,130,774 | A | 10/2000 | Albert et al. | 359/296 |
| 6,172,798 | B1 | 1/2001 | Albert et al. | 359/296 |
| 6,177,921 | B1 | 1/2001 | Comiskey et al. | 345/107 |
| 6,219,253 | B1 * | 4/2001 | Green | 361/761 |
| 6,239,896 | B1 | 5/2001 | Ikeda | 359/240 |
| 6,323,034 | B1 * | 11/2001 | Chen et al. | 436/30 |
| 6,461,901 | B1 * | 10/2002 | Noguchi | 438/158 |
| 2003/0141108 | A1 * | 7/2003 | Enomoto et al. | 174/262 |

FOREIGN PATENT DOCUMENTS

| | | |
|---|---|---|
| EP | 0 404 545 A2 | 12/1990 |
| EP | 0 443 571 A2 | 8/1991 |
| EP | 0 525 852 A1 | 2/1993 |
| EP | 0 618 715 A1 | 10/1994 |
| EP | 0 575 475 B1 | 5/1996 |
| EP | 0 709 713 A2 | 5/1996 |
| EP | 0 924 551 A1 | 6/1999 |
| EP | 1 024 540 A2 | 8/2000 |
| GB | 2 149 548 A | 6/1985 |
| GB | 2 098 800 A | 11/1992 |
| GB | 2 306 299 A | 4/1997 |
| JP | 62-058222 A | 3/1987 |
| JP | 63084089 * | 4/1988 |
| JP | 05-061421 A | 3/1993 |
| JP | 11-202804 A | 7/1999 |
| WO | WO 93/02443 | 2/1993 |
| WO | WO 93/05425 | 3/1993 |
| WO | WO 93/07608 | 4/1993 |
| WO | WO 95/05622 | 2/1995 |
| WO | WO 95/06307 | 3/1995 |
| WO | WO 95/07527 | 3/1995 |
| WO | WO 95/10107 | 4/1995 |
| WO | WO 97/04398 | 2/1997 |
| WO | WO 98/03896 | 1/1998 |
| WO | WO 98/19208 | 5/1998 |
| WO | WO 98/41898 | 9/1998 |
| WO | WO 98/41899 | 9/1998 |
| WO | WO 99/10767 | 3/1999 |

| | | |
|---|---|---|
| WO | WO 99/10768 | 3/1999 |
| WO | WO 99/10769 | 3/1999 |
| WO | WO 99/20682 | 4/1999 |
| WO | WO 99/40631 | 8/1999 |
| WO | WO 99/44229 | 9/1999 |
| WO | WO 99/45416 | 9/1999 |
| WO | WO 99/45582 | 9/1999 |
| WO | WO 99/47970 | 9/1999 |
| WO | WO 99/53371 | 10/1999 |
| WO | WO 99/53373 | 10/1999 |
| WO | WO 99/56171 | 11/1999 |
| WO | WO 99/59101 | 11/1999 |
| WO | WO 99/63527 | 12/1999 |
| WO | WO 99/65011 | 12/1999 |
| WO | WO 99/65012 | 12/1999 |
| WO | WO 99/67678 | 12/1999 |
| WO | WO 00/03291 | 1/2000 |
| WO | WO 00/03349 | 1/2000 |
| WO | WO 00/05312 | 2/2000 |
| WO | WO 00/05704 | 2/2000 |
| WO | WO 00/20921 | 4/2000 |
| WO | WO 00/20922 | 4/2000 |
| WO | WO 00/20923 | 4/2000 |
| WO | WO 00/22051 | 4/2000 |
| WO | WO 00/26761 | 5/2000 |
| WO | WO 00/36465 | 6/2000 |
| WO | WO 00/36560 | 6/2000 |
| WO | WO 00/36666 | 6/2000 |
| WO | WO 00/38000 | 6/2000 |
| WO | WO 00/38001 | 6/2000 |
| WO | WO 00/46854 | 8/2000 |
| WO | WO 00/49593 | 8/2000 |
| WO | WO 00/59625 | 10/2000 |
| WO | WO 00/60410 | 10/2000 |
| WO | WO 00/67110 | 11/2000 |
| WO | WO 00/67327 | 11/2000 |
| WO | WO 01/02899 | 1/2001 |
| WO | WO 01/07961 | 2/2001 |
| WO | WO 01/08241 | 2/2001 |
| WO | WO 01/08242 | 2/2001 |
| WO | WO 01/17029 | 3/2001 |
| WO | WO 01/17040 | 3/2001 |
| WO | WO 01/17041 | 3/2001 |

OTHER PUBLICATIONS

Comiskey, B., et al., "An electrophoretic ink for all–printed reflective electronic displays", Nature, 394, 253 (1998).

Dalisa, A.L., "Electrophoretic Display Technology", IEEE Trans. Electron Dev., ED–24, 827 (1977).

Drzaic, P., et al., "A Printed and Rollable Bistable Electronic Display", SID 98 Digest (1998), p. 1131.

Gleskova et al., IEEE Electron Device Letters, 20(9), 473 (1999).

Gutcho, M.H., Microcapsules and MIcroencapsulation Techniques, Noyes Data Corp., Park Ridge NJ, (1976), pp. 65–130, 178–193, 279–343.

Kornfeld, A Defect–Tolerant Active–Matrix Electrophoretic Display, SID Digest, 1984, p. 142.

Ma et al., Applied Physics Letters, 74(18), 2661 (1999)).

Moesner, F.M., et al., "Devices for Particle Handling by an AC Electric Field", IEEE, 1995, p. 66.

Nakamura, E., et al., "Development of Electrophoretic Display Using Microcapsulated Suspension," SID 98 Digest (1998), p. 1014.

Ota, I., et al., "Developments in Electrophoretic Displays", Proceedings of the SID, 18, 243 (1977).

Ota, I., et al., "Electrophoretic display devices", Laser 75 Optoelectronics Conference Proceedings, 145 (1975).

Ota., et al., "Electrophoretic Image Display (EPID) Panel", Proceedings of the IEEE, 61, 832 (1973).

Ridley, B.A. et al., "All–Inorganic Field Effect Transistors by Printing," Science, 286, 746 (1999).

Shiffman, R.R., et al., "An Electrophoretic Image Display with Internal NMOS Address Logic and Display Drivers," Proceedings of the SID, 1984, vol. 25, 105 (1984).

Vandegaer, J.E. (ed.), "Microencapsulation Processes and Applications", pp. v–x, 1–180 (Plenum Press, New York 1974).

* cited by examiner

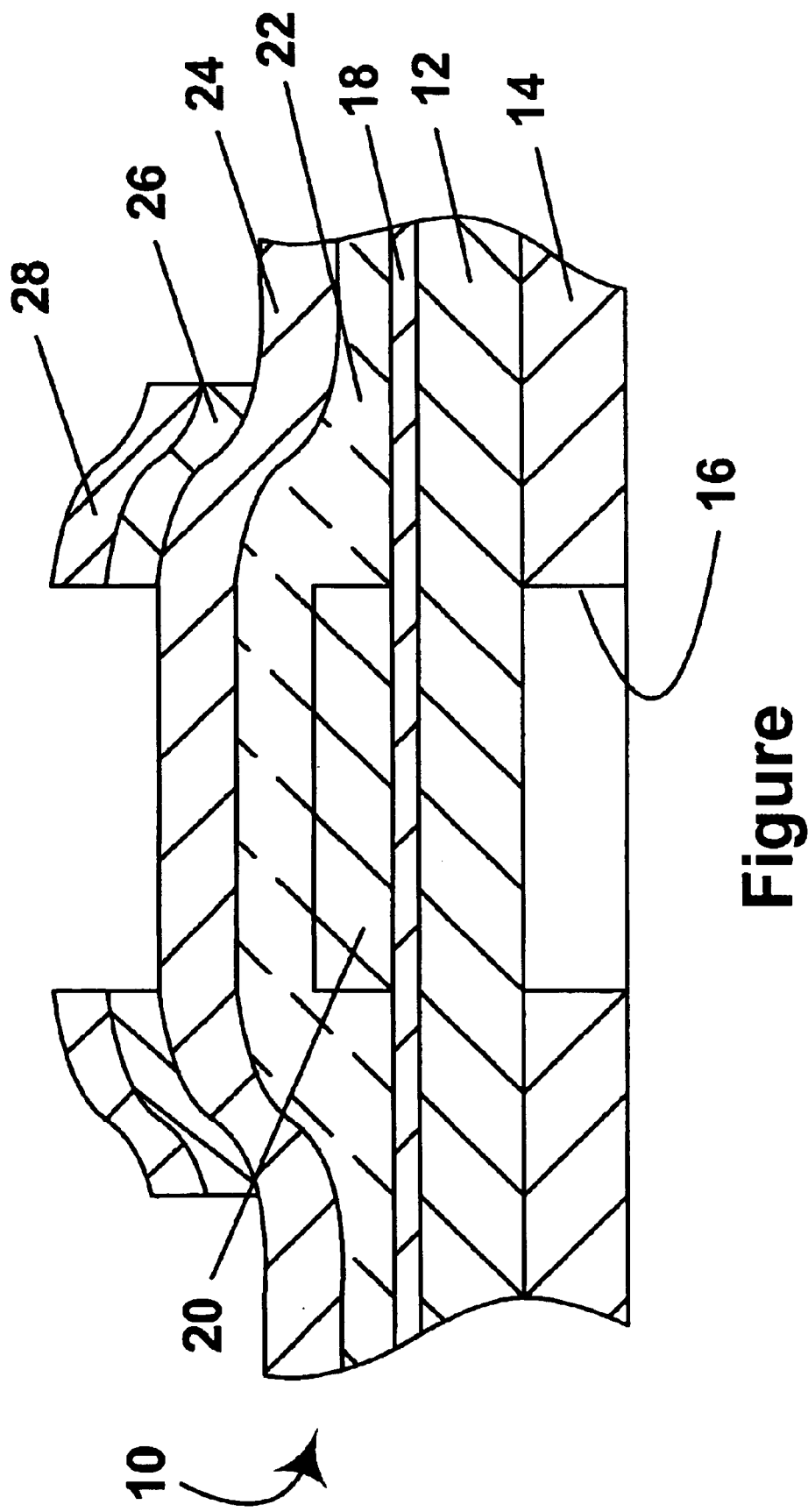

PROCESS FOR FABRICATING THIN FILM TRANSISTORS

This application claims benefit of 60/197,731 filed on Apr. 18, 2000.

BACKGROUND OF THE INVENTION

This invention relates to a process for fabricating thin film transistors.

Thin film transistors (TFT's) are known to be useful for, inter alia, controlling various types of display; for example TFT's are commonly used to control liquid crystal displays used in portable computers and similar electronic devices. TFT's can also be used to control electrophoretic displays; see, for example, Applications Ser. Nos. 60/132,642, filed May 5, 1999 and Ser. No. 09/565,413, filed May 5, 2000; Applications Ser. Nos. 60/144,943, filed Jul. 21, 1999, 60/147,989, filed Aug. 10, 1999, and Ser. No. 09/621,000, filed Jul. 22, 2000; Applications Ser. Nos. 60/151,547, filed Aug. 31, 1999, and Ser. No. 09/652,486, filed Aug. 31, 2000; Applications Ser. Nos. 60/151,715 and 60/151,716, both filed Aug. 31, 1999, and Ser. No. 09/651,710, filed Aug. 31 2000; and Applications Ser. Nos. 60/151,549, filed Aug. 31, 1999 and Ser. No. 09/650,620, filed Aug. 30, 2000. The disclosures of all these copending applications are herein incorporated by reference. See also the corresponding International Applications Publication Nos. WO 00/67327; WO 01/08241; WO 01/17029; WO 01/17040; and WO 01/17041.

Although most TFT's have hitherto been fabricated on rigid substrates, there is increasing interest in fabricating TFT's on flexible substrates, especially flexible polymeric films. TFT's fabricated on such flexible substrates could form the basis for large displays which would be lightweight yet rugged, thus permitting their use in mobile devices. TFT's based upon amorphous silicon semiconductors are attractive for use on such flexible substrates since they allow fabrication with a minimum number of process steps and with a low thermal budget. Amorphous silicon transistors have been fabricated on ultra-thin stainless steel substrates (see, for example, Ma et al., Applied Physics Letters, 74(18), 2661 (1999)) and on polyimide films (see Gleskova et al., IEEE Electron Device Letters, 20(9), 473 (1999)).

However, the polyimide used in the process described in the latter paper, sold commercially under the name "Kapton" (Registered Trade Mark) has a glass transition temperature of only about 300° C., which restricts the temperatures which can be employed during the fabrication process, and results in a less satisfactory amorphous silicon semiconductor layer. This polyimide also has a high moisture absorption (about 4 percent by weight) and such high moisture absorption can result in swelling of the substrate and consequent cracking of thin layers deposited on the substrate, or delamination of thin layers from the substrate. Although stainless steel substrates can withstand process temperatures much higher than 300° C., such substrates require both passivation and planarization steps before transistors can be fabricated thereon. Passivation is required to ensure proper electrical isolation between adjoining metal conductors to be formed on the substrate, and to ensure that potential contaminants within the stainless steel do not diffuse into the transistors. Stainless steel substrates do, however, have the advantages of high dimensional stability and ease of handling in a manufacturing environment.

It has now been discovered that certain types of polyimides possess properties which render them very suitable for use as substrates in the fabrication of TFT's. These polyimide substrates may be used with or without a metal backing layer.

SUMMARY OF THE INVENTION

Accordingly, this invention provides a process for forming at least one transistor on a substrate by depositing on the substrate at least one layer of semiconductor material. In the present process, the substrate comprises a polyphenylene polyimide. This process is especially intended for the formation of amorphous silicon transistors, and in such a case the semiconductor material is of course an amorphous silicon.

This invention also provides a transistor formed on a substrate comprising a polyphenylene polyimide, the substrate bearing at least one transistor.

BRIEF DESCRIPTION OF THE DRAWING

The sole FIGURE of the accompanying drawing is a schematic cross-section through a single transistor of a thin film transistor array formed on a polyimide substrate by the process of the present invention.

DETAILED DESCRIPTION OF THE INVENTION

Preferred polyphenylene polyimides for use in the present process are those sold commercially under the trade names Upilex-S and Upilex-VT by UBE America, Inc., 55 East 59th Street, 18th Floor, New York N.Y. 10022. Both these materials are stated by the manufacturer to be of the formula:

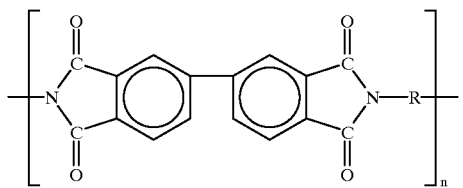

in which R is an alkylene group. These polyimides are derivatives of biphenyl-3,3',4,4'-tetracarboxylic acid and an $\alpha,\omega$-alkanediamine, for example 1,6-hexamethylene diamine (formally hexane-1,6-diamine). The main difference between the two materials is that Upilex-S is a simple polyimide film, while Upilex-VT is surface-treated on one face to facilitate hot lamination of the film, without adhesive, to ceramics or metal foils. For purposes of the present invention, the Upilex VT may be laminated to a stainless steel backing film. Another preferred polyimide for use in the present process is Upilex-50SS, from the same manufacturer.

Polyphenylene polyimides have glass transition temperatures considerably higher, and water absorptions considerably lower, than those of the other polyimides previously used as transistor substrates. The commercial Upilex materials already mentioned have glass transition temperatures in excess of 400° C. and water absorptions not greater than about 1.4 percent. These high glass transition temperatures allow the use of higher temperatures (greater than about 300° C., and preferably greater than about 400° C.) in the fabrication process than has hitherto been possible with the polyimides previously used as transistor substrates, and these higher process temperatures result in higher quality silicon layers having higher mobility and low off-state current leakage. Polyphenylene polyimides also have the advantages of high dimensional stability during processing and smooth surfaces, which is important for the deposition of the thin layers of material used in the formation of thin film transistors; for example, the aforementioned Upilex-50SS has a dimensional stability of about 0.01% and an average surface roughness of about 20 to 30 nm. An additional advantage of polyphenylene polyimides is their low coefficients of thermal expansion, which are typically about $2$–$10 \times 10^{-6}$ $°C.^{-1}$, in contrast to the $35 \times 10^{-6}$ $°C.^{-1}$ typical of the polyimides previously used. Since silicon has a coefficient of thermal expansion of about $3 \times 10^{-6}$ $°C.^{-1}$, the coefficient of a polyphenylene polyimide substrate is much more closely matched to a silicon layer deposited thereon, so that the silicon layer is much less prone to cracking and/or delamination.

The aforementioned properties of polyphenylene polyimide substrates render the present process well adapted for use in a roll-to-roll process, in which deposition of the semiconductor material is effected on a continuous web of the polyimide substrate.

As already mentioned, the polyphenylene polyimide substrate used in the present process may or may not have a metal backing layer on its surface opposite to that on which the semiconductor material is to be deposited. Such a metal backing layer is useful in enhancing the mechanical integrity of the film during the transistor fabrication process, thus avoiding, for example, any tendency for the polyimide film to stretch or otherwise distort during handling, and thus reducing distortion of the substrate during formation of the transistors thereon. In addition, a metal backing layer can act as a light barrier to decrease any unwanted photo-effects in the semiconductor material (for example, photogenerated current in an amorphous silicon film) caused by light incident on the rear surface of the polyimide film. The metal backing layer need not be continuous; this layer may have apertures extending through it to reduce its stiffness and thus give the metal-backed substrate more flexibility. If such apertures are to be provided, for obvious reasons it is desirable that they be formed in a regular pattern, and accordingly some or all of the apertures may be used for mechanical registration of the substrate with apparatus used in the fabrication process. Indeed, in some cases, a patterned metal backing layer might be used as a shadow mask for exposure of photoresist in a patterning step during formation of the transistors on the substrate. Alternatively or in addition, it may be advantageous to incorporate a dye into the polyimide itself to refuse or eliminate such undesirable photo-effects.

As in certain prior art processes, it may be desirable to deposit a passivating layer of silica, aluminum nitride, silicon nitride or other material on the substrate prior to the deposition of the transistors on this substrate. Typically, such a passivating layer will have a thickness in the range of about 20 to about 100 nm. Passivation is useful not only for increasing the surface resistance of the polyimide surface, and thus for increasing electrical insulation between adjacent conductors, but also for increasing the dimensional stability of the substrate by preventing the substrate absorbing water during processing, and for the latter purpose it is desirable to place the passivating layer on both surfaces of the substrate. It is also desirable to heat treat ("bake") the substrate to remove water from the substrate prior to the deposition of the passivating layer; such baking will generally be carried out at a temperature of at least about 150° C. for a period of at least about 1 minute, and preferably for about 3 minutes.

It may also be advantageous to post-bake the passivated substrate. According to a paper by Philips Research Laboratories entitled "AMLCDs and Electronics on Polymer Substrates" (Euro Display 1996), the shrinkage rate of a free-standing polyimide film can be reduced by two orders of magnitude after 10 hours of heating at 275° C., and by 2.4 orders of magnitude after 100 hours at the same temperature. In one specific experiment described in this paper, after 100 baking at 275° C., a polyimide film (brand not specified) shrank at 3 ppm $hr^{-1}$. Accordingly, if such post-baking of the passivated substrate is desired, it should be carried out at a temperature of at least about 250° C. for a period of at least about 5 hours. It has not been determined experimentally whether these results apply the substrate in the form of a tensioned roll, nor has it been determined experimentally whether the reduction in shrinkage still applies after the pre-baked substrate is cooled, unrolled, exposed to the processing necessary to form transistors thereon, re-rolled under tension and reheated several days later, as is necessary for formation of transistors on the substrate in a roll-to-roll process. Alternatively, the substrate could be pre-baked in a conveyor oven immediately before deposition of the layers required to form the transistor.

The surface electrical resistivity of polyphenylene polyimides is, however, so high (typically $>10^{16}$ $\Omega$) that in many cases it may be possible to obtain adequate electrical insulation between adjacent conductors without such a passivating layer. If the passivating layer is omitted, it is still advantageous to bake the substrate before deposition of the semiconductor layer thereon in order to drive off water and any other volatile materials absorbed on the polyimide, thus reducing swelling of the polyimide due to water absorption and increasing the dimensional stability of the polyimide during the formation of transistors thereon. Such baking is desirably effected at a temperature greater than about 250° C. for a period of at least about 1 hour. In one preferred embodiment described below, the substrate is heated to 350° C., close to its glass transition temperature, for a period of 4 hours.

The presently preferred embodiments of the invention described below use an inverted transistor design, in which the gate electrodes lie adjacent the substrate. To form such inverted transistors, the first step (after any passivation and/or pre-baking of the substrate in the ways already described) is the deposition of a metal layer on the substrate. The preferred metal for this purpose is chromium. It is generally preferred to deposit the chromium or other metal as a continuous film, typically having a thickness in the range of about 50 to about 200 nm, and thereafter to pattern the metal film, typically by conventional photolithographic techniques, prior to the deposition of the semiconductor material, to form the gate electrodes and the select lines of the transistor array to be formed. The next step in the process is normally the deposition of a layer of dielectric material, for example silicon nitride; this deposition is conveniently effected by plasma enhanced chemical vapor deposition. The semiconductor material, preferably amorphous silicon, is then deposited, again conveniently by plasma enhanced chemical vapor deposition. As discussed in the aforementioned copending application Ser. No. 09/565,413 and WO 00/67327, the amorphous silicon layer (and the associated dielectric layer) can, in an appropriate design, be left unpatterned so that the amorphous silicon layer extends continuously between pairs of adjacent transistors. Next, a layer of n-type silicon is deposited over the amorphous silicon, again conveniently by plasma enhanced chemical vapor deposition. Finally, normally after a cleaning step to remove residues from the chemical vapor deposition processes, a metal layer, for example an aluminum layer, is deposited over the n-type silicon layer, this metal layer conveniently being deposited by thermal evaporation. The metal layer can then be patterned to form source and drain electrodes by conventional photolithographic techniques, and the patterned metal layer used as an etch mask for a reactive ion etch of the n-type silicon layer; etching with a carbon tetrafluoride/oxygen mixture has been found satisfactory.

Preferred embodiments of the invention will now be described in more detail, though by way of illustration only, with reference to the accompanying drawing, which shows a schematic cross-section through a single transistor formed on a polyphenylene polyimide substrate by the process of the present invention.

The accompanying drawing shows a single transistor of a transistor array (generally designated 10) formed on a polyphenylene polyimide substrate 12. This substrate 12 is shown in the drawing provided with a stainless steel metal backing layer 14 through which extend regularly-spaced apertures 16, only one of which is visible in the drawing. As already mentioned, the presence of the metal backing layer 14 is optional in the process of the present invention, although such a metal backing layer does provide additional mechanical integrity to the substrate and may thus facilitate handling of the substrate, especially when the invention is to be carried out on roll-to-roll coating apparatus.

On the upper surface of the substrate 12 (as shown in the drawing), there is deposited a passivating layer 18 formed of silica or silicon nitride. As previously mentioned, the presence of such a passivating layer 18 is optional, and in some cases the passivating layer 18 may be omitted, since the high surface resistivity of the polyphenylene polyimide provides sufficient insulation between adjacent transistors. Care should, however, be taken in eliminating the passivating layer 18 since if this layer is not present out-gassing from the polyimide substrate 12 may tend to cause delamination of various layers from this substrate.

On the upper surface of passivating layer 18, there are deposited an array of spaced metal gate electrodes 20 (only one of which is seen in the drawing), and above the electrodes 20 are deposited successively a dielectric layer 22, formed of silicon nitride, and a layer 24 of amorphous silicon. As discussed in the aforementioned copending application Ser. No. 09/565,413 and WO 00/67327, the dielectric layer 22 and the amorphous silicon layer 24 can be left unpatterned, and avoiding the need to pattern these layers substantially reduces the cost of the transistor array. Finally, the transistor array comprises a layer 26 of n-type silicon and a metal electrode layer 28; both of these layers are patterned using any conventional process to provide the source and drain electrodes of the transistors.

A second preferred embodiment of the invention is generally similar to that described above, but used a polyimide substrate without a metal backing or passivating layer. In this second preferred embodiment, the aforementioned Upilex-50SS was first baked for 4 hours at 350° C. to remove water and any other solvents present. A layer of chrome 100 nm. thick was deposited upon the baked substrate by thermal evaporation and photolithographically patterned to form the gate electrodes and select lines of the final transistor array. Next, a 320 nm. layer of silicon nitride dielectric was deposited on the substrate by plasma enhanced chemical vapor deposition (PECVD) using a silane/ammonia mixture; during this deposition, the substrate reached its maximum processing temperature of 350° C. A 160 nm layer of amorphous silicon semiconductor material was then deposited by PECVD from pure silane, followed by deposition of a 40 nm layer of n-type amorphous silicon by PECVD from a silane/phosphine mixture.

Following these PECVD steps, a layer of aluminum was deposited on the substrate and patterned photolithographically to form the source and drain electrodes of the transistor array. The substrate was then subjected to a reactive ion etch using a carbon tetrafluoride/oxygen mixture to pattern the n-type silicon layer using the patterned aluminum layer as an etch mask; for the reasons already explained, the amorphous silicon and silicon nitride layers were not patterned during this step. Finally, a low resolution patterning step was used to pattern the amorphous silicon and silicon nitride layers to enable electrical contact to be made with the select bond line sites.

The thin film transistor array thus fabricated can be used directly in the manufacturer of an electrophoretic display, or other types of display, without further processing. For example, the thin film transistor array shown in the drawing could be incorporated into an electrophoretic display by the process described in application Ser. No. 09/461,463, filed Dec. 15, 1999; the entire disclosure of this copending application is herein incorporated by reference. In some cases, it is desirable to provide a barrier layer covering the thin film transistors to protect the transistors against the effects of solvents or other materials which may tend to diffuse out of the electrophoretic display.

As already mentioned, thin film transistor arrays produced by the process of the present invention are especially intended for use in electrophoretic displays, especially encapsulated electrophoretic displays such as those described in U.S. Pat. Nos. 5,930,026; 5,961,804; 6,017,584; 6,067,185; 6,118,426; 6,120,588; 6,120,839; 6,124,851; 6,130,773; 6,130,774; and 6,172,798, and in International Applications Publication Nos. WO 97/04398; WO 98/03896; WO 98/19208; WO 98/41898; WO 98/41899; WO 99/10769; WO 99/10768; WO 99/10767; WO 99/53373; WO 99/56171; WO 99/59101; WO 99/47970; WO 00/03349; WO 00/03291; WO 99/67678; WO 00/05704; WO 99/53371; WO 00/20921; WO 00/20922; WO 00/20923; WO 00/26761; WO 00/36465; WO 00/38000; WO 00/38001; WO 00/36560; WO 00/20922; WO 00/36666; WO 00/59625; WO 00/67110; WO 00/67327 and WO 01/02899. The entire disclosures of all these patents and published applications are herein incorporated by reference. In view of the numerous different materials and manufacturing techniques which can be employed in such electrophoretic displays, the following Sections A-E are given by way of general guidance.

A. Electrophoretic Particles

There is much flexibility in the choice of particles for use in electrophoretic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Zinc sulfide electroluminescent particles may be encapsulated with an insulative coating to reduce electrical conduction. Finally, the particles may be surface treated so as to improve charging or interaction with a charging agent, or to improve dispersability.

One particle for use in electrophoretic displays of the invention is titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, Hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Black, CBS (E. I. du Pont de Nemours and Company, Inc., Wilmington, Del., hereinafter abbreviated "du Pont"), Crocein Scarlet N Ex (du Pont) (27290), Fiber Black VF (du Pont) (30235), Luxol Fast Black L (du Pont) (Solv. Black 17), Nirosine Base No. 424 (du Pont) (50415 B), Oil Black BG (du Pont) (Solv. Black 16), Rotalin Black RM (du Pont), Sevron Brilliant Red 3 B (du Pont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Black 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Black 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 $\mu$m), Statex B-12 (Columbian Carbon Co.) (a furnace black of 33 $\mu$m average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 $\mu$m, as long as the particles are smaller than the bounding capsule. The density of the electrophoretic particle may be substantially matched to that of the suspending (i.e., electrophoretic) fluid. As defined herein, a suspending fluid has a density that is "substantially matched" to the density of the particle if the difference in their respective densities is between about zero and about two grams/milliliter ("g/ml"). This difference is preferably between about zero and about 0.5 g/ml.

Useful polymers for the particles include, but are not limited to: polystyrene, polyethylene, polypropylene, phenolic resins, du Pont Elvax resins (ethylene-vinyl acetate copolymers), polyesters, polyacrylates, polymethacrylates, ethylene acrylic acid or methacrylic acid copolymers (Nucrel Resins—du Pont, Primacor Resins—Dow Chemical), acrylic copolymers and terpolymers (Elvacite Resins—du Pont) and PMMA. Useful materials for homopolymer/pigment phase separation in high shear melt include, but are not limited to, polyethylene, polypropylene, poly(methyl methacrylate), poly(isobutyl methacrylate), polystyrene, polybutadiene, polyisoprene, polyisobutylene, poly(lauryl methacrylate), poly(stearyl methacrylate), poly (isobornyl methacrylate), poly(t-butyl methacrylate), poly (ethyl methacrylate), poly(methyl acrylate), poly(ethyl acrylate), polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. For example, the processes and materials for both the fabrication of liquid toner particles and the charging of those particles may be relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles may be drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 μm. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles is to add the polymer, pigment, and suspending fluid to a media mill. The mill is started and simultaneously heated to a temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{15}$ ohm-cm), low viscosity (less than 5 centistokes ("cst")), low toxicity and environmental impact, low water solubility (less than 10 parts per million ("ppm")), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when movement of the particles is desired. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles, because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as decane epoxide and dodecane epoxide; vinyl ethers, such as cyclohexyl vinyl ether and Decave® (International Flavors & Fragrances, Inc., New York, N.Y.); and aromatic hydrocarbons, such as toluene and naphthalene. Useful halogenated organic solvents include, but are not limited to, tetrafluorodibromoethylene, tetrachloroethylene, trifluorochloroethylene, 1,2,4-trichlorobenzene and carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (a series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly(methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated Hydrocarbon Inc., River Edge, N.J.), Galden® (a perfluorinated ether from Ausimont, Morristown, N.J.), or Krytox® from du Pont (Wilmington, Del.). In a preferred embodiment, the suspending fluid is a poly(chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. One surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable by, for example, thermal, photochemical or chemical diffusion processes, forming a solid absorbing polymer inside the bounding shell.

There are many dyes that can be used in encapsulated electrophoretic displays. Properties important here include light fastness, solubility in the suspending liquid, color, and cost. These dyes are generally chosen from the classes of azo, anthraquinone, and triphenylmethane type dyes and may be chemically modified so as to increase their solubility in the oil phase and reduce their adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

The ratio of particles to suspending fluid to suspending fluid may vary over a wide range depending upon, inter alia, the density and opacity of the particles, the desired switching speed of the display and the degree of bistability desired. Typically, the particles will comprise from about 0.5 per cent to about 20 per cent by weight of the internal phase. However, in some dual particle systems, it may be advantageous to use substantially higher particle loadings in order to enhance the bistability of the images produced. Dual particle electrophoretic media in which the two types of particles carry charges of opposite polarity flocculate naturally because of the electrostatic attraction between the oppositely-charged particles. At high particles loadings, with the particles constituting around 50 to 70 weight per cent of the internal phase, the resultant floc structure essentially fills the volume of the internal phase and holds the particles close to their addressed state (i.e., close to the positions which they occupy after an electric field has been applied to the medium for a period sufficient to drive the display to one of its two extreme optical states), thus enhancing the bistability of the display. The density, strength and rate of flocculation are readily controlled by adjusting particle charge, size and steric barrier thickness and composition. This method of increasing by increasing particle loading has the advantage that no extraneous material is added to the internal phase, and that the floc structure will stabilize not only the two extreme optical states but also the intermediate "gray" states. Also, this method reduces the temperature sensitivity of the stable states and reduces sticking of the particles to the capsule walls. The Bingham viscosity of the internal phase remains low, and even small floc volumes will aid in maintaining image bistability. Finally, the floc structure is easily broken by a short alternating current pulse, which can readily be applied before the direct current pulse used to alter the optical state of the display.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be a single pure compound or a mixture. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness.

Charge adjuvants may also be added. These materials increase the effectiveness of the charge control agents or charge directors. The charge adjuvant may be a polyhydroxy compound or an aminoalcohol compound, and is preferably soluble in the suspending fluid in an amount of at least 2% by weight. Examples of polyhydroxy compounds which contain at least two hydroxyl groups include, but are not limited to, ethylene glycol, 2,4,7,9-tetramethyldecyn-4,7-diol, poly(propylene glycol), pentaethylene glycol, tripropylene glycol, triethylene glycol, glycerol, pentaerythritol, glycerol tris(12-hydroxystearate), propylene glycerol monohydroxy-stearate, and ethylene glycol monohydroxystearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol, 5-amino-1-pentanol, and tetrakis(2-hydroxyethyl)ethylenediamine. The charge adjuvant is preferably present in the suspending fluid in an amount of about 1 to about 100 milligrams per gram ("mg/g") of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor®) TOT, TBT, and TE Series, du Pont); hydrophobing agents, such as long chain ($C_{12}$ to $C_{50}$) alkyl and alkyl benzene sulphonic acids, fatty amines or diamines and their salts or quaternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethylhexyl) sulfosuccinate, calcium dodecylbenzenesulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulfate. Useful metal soaps include, but are not limited to, basic or neutral barium petronate, calcium petronate, Co—, Ca—, Cu—, Mn—, Ni—, Zn—, and Fe— salts of naphthenic acid, Ba—, Al—, Zn—, Cu—, Pb—, and Fe— salts of stearic acid, divalent and trivalent metal carboxylates, such as aluminum tristearate, aluminum octanoate, lithium heptanoate, iron stearate, iron distearate, barium stearate, chromium stearate, magnesium octanoate, calcium stearate, iron naphthenate, zinc naphthenate, Mn— and Zn— heptanoate, and Ba—, Al—, Co—, Mn—, and Zn— octanoate. Useful block or comb copolymers include, but are not limited to, AB diblock copolymers of (A) polymers of 2-(N,N-dimethylamino)ethyl methacrylate quaternized with methyl p-toluenesulfonate and (B) poly(2-ethylhexyl methacrylate), and comb graft copolymers with oil soluble tails of poly(12-hydroxystearic acid) and having a molecular weight of about 1800, pendant on an oil-soluble anchor group of poly(methyl methacrylate-methacrylic acid). Useful organic amides include, but are not limited to, polyisobutylene succinimides such as OLOA 1200, and N-vinylpyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, non-aqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

Encapsulation of the internal phase may be accomplished in a number of different ways. Numerous suitable procedures for microencapsulation are detailed in both Microencapsulation, Processes and Applications, (I. E. Vandegaer, ed.), Plenum Press, New York, N.Y. (1974) and Gutcho, Microcapsules and Microencapsulation Techniques, Noyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes to form the capsule include, but are not limited to, gelatin, poly(vinyl alcohol), poly(vinyl acetate), and cellulosic derivatives, such as, for example, carboxymethylcellulose. Useful materials for complex coacervation processes include, but are not limited to, gelatin, acacia, carageenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, poly (methyl methacrylate) (PMMA), poly(ethyl methacrylate), poly(butyl methacrylate), ethyl cellulose, poly (vinylpyridine), and polyacrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, methyl methacrylate (MMA) and acrylonitrile. Finally, useful materials for interfacial polymerization processes include, but are not limited to, diacyl chlorides, such as, for example, sebacoyl, adipoyl, and di- or poly- amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation technique that is suited to the present invention involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic fluid (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one in situ polymerization process, urea and formaldehyde condense in the presence of poly(acrylic acid) (see, e.g., U.S. Pat. No. 4,001,140). In other processes, described in U.S. Pat. No. 4,273,672, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and polyisocyanates.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic. See, e.g., U.S. Pat. No. 2,800,457.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer-based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from du Pont, the Fluorad® series from 3M (St. Paul, Minn.), and the fluoroalkyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkylbenzenes, natural fats, fatty acids, and metallic soaps, and silicone antifoaming agents made from the combination of dimethyl siloxane polymers and silica. Stabilizers such as UV-absorbers and antioxidants may also be added to improve the lifetime of the ink.

E. Binder Material

The binder typically is used as an adhesive medium that supports and protects the capsules, as well as binds the electrode materials to the capsule dispersion. A binder can be non-conducting, semiconductive, or conductive. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrolidone, the various Carbowax® species (Union Carbide, Danbury, Conn.), and poly(2-hydroxyethyl acrylate).

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a cross-linking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60× gravity ("g"), the capsules 180 are found at the bottom of the centrifuge tube 182, while the water portion 184 is at the top. The water portion is carefully removed (by decanting or pipetting). The mass of the remaining capsules is measured, and a mass of resin is added such that the mass of resin is, for example, between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the water-borne system, with the obvious exception of the water itself. The latitude in formulation for solvent systems is enormous, limited only by solvent choices and polymer solubility. Of considerable concern in solvent-based systems is the viability of the capsule itself, the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and cross-linkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

Like other encapsulated electrophoretic displays, the encapsulated electrophoretic displays of the present invention provide flexible, reflective displays that can be manufactured easily and consume little power (or no power in the case of bistable displays in certain states). Such displays, therefore, can be incorporated into a variety of applications and can take on many forms. Once the electric field is removed, the electrophoretic particles can be generally stable. Additionally, providing a subsequent electric charge can alter a prior configuration of particles. Such displays may include, for example, a plurality of anisotropic particles and a plurality of second particles in a suspending fluid. Application of a first electric field may cause the anisotropic particles to assume a specific orientation and present an optical property. Application of a second electric field may then cause the plurality of second particles to translate, thereby disorienting the anisotropic particles and disturbing the optical property. Alternatively, the orientation of the anisotropic particles may allow easier translation of the plurality of second particles. Alternatively or in addition, the particles may have a refractive index that substantially matches the refractive index of the suspending fluid.

An encapsulated electrophoretic display may take many forms. The capsules of such a display may be of any size or shape. The capsules may, for example, be spherical and may have diameters in the millimeter range or the micron range, but are preferably from about ten to about a few hundred microns. The particles within the capsules of such a display may be colored, luminescent, light-absorbing or transparent, for example.

Numerous changes and modifications can be made in the preferred embodiments of the present process already described without departing from the spirit and skill of the invention. For example, the present invention is not restricted to the fabrication of bottom gate transistors such as that shown in the accompanying drawings, the court also be used in the fabrication of top gate transistors, in which the source and drain electrodes are first fabricated on the substrate (with or without a passivating layer), then an amorphous silicon layer and a dielectric layer are formed on top of the electrodes, and finally the gate electrodes are formed as the top layer of the structure. Accordingly, the foregoing description is to be construed in an illustrative and not in a limitative sense.

From the foregoing, it will be seen that the process of the present invention provides a process for forming transistors on a flexible substrate which permits the use of higher processing temperatures than prior art processes, and which can thus produce semiconductor layers of higher quality than prior art processes. The substrate used in the present process has a coefficient of thermal expansion which closely matches that of most semiconductor layers, so reducing the risk of cracking and/or delamination of the semiconductor layer due to differences in thermal expansion between this layer and the substrate. The present invention provides a process which is well-adapted to roll-to-roll operation, and thus the present process is very suitable for the fabrication of large area transistor arrays on flexible substrates.

What we claim is:

1. A process for forming at least one transistor on a substrate, which process comprises depositing on the substrate at least one layer of semiconductor material, wherein the substrate comprises a polyphenylene polyimide.

2. A process according to claim 1 wherein the polyphenylene polyimide is a derivative of biphenyl-3,3',4,4'-tetracarboxylic acid.

3. A process according to claim 2 wherein the polyimide is a derivative of biphenyl-3,3',4,4'-tetracarboxylic acid and an $\alpha,\omega$-alkanediamine.

4. A process according to claim 1 wherein a passivating layer is deposited on the substrate before the semiconductor material is deposited thereon.

5. A process according to claim 4 wherein the passivating layer comprises silicon dioxide or aluminum nitride.

6. A process according to claim 4 wherein the passivating layer has a thickness in the range of about 20 to about 100 nm.

7. A process according to claim 4 wherein the passivating layer is deposited on both surfaces of the substrate.

8. A process according to claim 4 wherein the substrate is heated to a temperature greater than about 150° C. for a period of at least about 1 minute before deposition of the passivating layer.

9. A process according to claim 4 wherein the substrate is heated to a temperature greater than about 250° C. for a period of at least about 5 hours after deposition of the passivating layer.

10. A process according to claim 1 wherein the substrate is heated to a temperature greater than about 250° C. for a period of at least about 1 hour before deposition of the semiconductor material.

11. A process according to claim 1 wherein the substrate comprises a metal layer on the side thereof remote from the semiconductor material.

12. A process according to claim 11 wherein the metal layer has walls defining apertures extending through the metal layer.

13. A process according to claim 1 wherein the deposition of the semiconductor material is effected at a temperature in excess of about 300° C.

14. A process according to claim 1 wherein a metal layer is deposited upon the substrate on the same side thereof as the semiconductor material but prior to the deposition of the semiconductor material.

15. A process according to claim 14 wherein the metal layer comprises chromium.

16. A process according to claim 14 wherein the metal layer is deposited as a continuous film and is thereafter patterned prior to deposition of the semiconductor material thereon.

17. A process according to claim 14 wherein a layer of dielectric material is deposited over the metal layer prior to the deposition of the semiconductor material.

18. A process according to claim 17 wherein the dielectric layer comprises silicon nitride.

19. A process according to claim 1 wherein the dielectric layer is deposited by plasma enhanced chemical vapor deposition.

20. A process according to claim 1 wherein the semiconductor material comprises amorphous silicon.

21. A process according to claim 20 wherein the semiconductor material is deposited by plasma enhanced chemical vapor deposition.

22. A process according to claim 20 wherein the amorphous silicon is not patterned so that it extends continuously between at least some pairs of adjacent transistors.

23. A process according to claim 20 wherein the semiconductor material further comprises a layer of n-type silicon deposited over the amorphous silicon.

24. A process according to claim 23 wherein a continuous layer of the n-type silicon is deposited over the amorphous silicon, a patterned layer of metal is thereafter formed over the n-type silicon, and the resultant structure is thereafter etched to remove portions of the n-type silicon not covered by the patterned layer of metal.

25. A process according to claim 1 wherein deposition of the semiconductor material is effected on a continuous web of substrate.

* * * * *